United States Patent [19]

Frary et al.

[11] Patent Number: 5,289,412
[45] Date of Patent: Feb. 22, 1994

[54] HIGH-SPEED BIAS-STABILIZED CURRENT-MIRROR REFERENCING CIRCUIT FOR NON-VOLATILE MEMORIES

[75] Inventors: Kevin W. Frary, Fair Oaks; Sachidanandan Sambandan, Folsom, both of Calif.

[73] Assignee: Intel Corporation, Santa Clara, Calif.

[21] Appl. No.: 901,395

[22] Filed: Jun. 19, 1992

[51] Int. Cl.$^5$ .............................................. G11C 7/00
[52] U.S. Cl. .................................... 365/185; 365/210; 365/189.01
[58] Field of Search ............... 365/185, 104, 184, 210, 365/206, 207, 208, 189.09, 189.01

[56] References Cited

U.S. PATENT DOCUMENTS 4,807,188  2/1989  Casagrande ..................... 365/185
5,163,021  11/1992  Mehrotra et al. ................. 365/185

Primary Examiner—Eugene R. LaRoche
Assistant Examiner—Vu Le
Attorney, Agent, or Firm—Blakely Sokoloff Taylor & Zafman

[57] ABSTRACT

A circuit for providing reference voltages to be used by sense amplifiers of output circuitry of an integrated circuit memory array to allow the sense amplifiers to ascertain the values stored by memory cells of the array. The circuit includes a first branch which has transistor circuitry for establishing a reference current, a second branch of the circuit including a first transistor device and apparatus for mirroring the reference current through the first transistor device, and a plurality of output branches each connected to a sense amplifier to provide a reference voltage to be used by the sense amplifier. Each of the output branches includes a second transistor device with characteristics essentially identical to the characteristics of the first transistor device. Apparatus is included in the output branches for providing voltages at all terminals of the second transistor devices equal to the voltages at all terminals of the first transistor device so that the reference current through each of the second transistor devices is forced to be identical to that through the first transistor device. The second branch is replicated to increase current available and circuit speed.

5 Claims, 3 Drawing Sheets

HIGH-SPEED BIAS-STABILIZED CURRENT-MIRROR REFERENCING CIRCUIT FOR NON-VOLATILE MEMORIES

BACKGROUND OF THE INVENTION

1. Field Of The Invention

This invention relates to memory arrays and, more particularly, to circuits for generating reference values for use with the sensing circuits of a memory array.

2. History Of The Prior Art

Integrated circuit memories utilize sensing circuits to extract data from the memory cells of the array. Sensing circuits generate a reference voltage or current to compare with a level stored in the memory cells. The result of the comparison is used to generate a logic "0" or "1" at the output of the sensing circuit. The number of sensing circuits contained in an integrated circuit memory is basically equal to the number of bits that the device furnishes as a parallel output. For example, a byte-wide memory requires eight sets of sensing circuits and a word-wide memory requires sixteen sets of sensing circuits.

The most accurate method of generating a reference voltage or current for non-volatile memories is to construct a reference cell which uses devices that exactly match the memory cells. These reference cells will then track the characteristics of the memory array in spite of variations in processing, temperature, and supply voltage. This results in very reliable, high performance sensing operations. Since the reference cells have been required for each set of sensing circuits, the number of these cells and their support circuitry can use significant die area. Moreover, the devices of the reference cells are often adjusted or trimmed during production testing for improved performance. This trimming of a large number of reference cells can consume a significant amount of test time, substantially increasing the cost of the memory array.

An approach to reducing the number of reference cells is to "mirror" the current from a single reference cell to each set of sensing circuits throughout the die, thus reducing die cost, by minimizing die area and test time. This concept is relatively straight forward and has been used in prior art devices. However, this approach is limited from a performance standpoint due to the inherent inaccuracy of the mirroring circuits and the relatively slow power-up time when a large number of sensing circuits are connected.

It is, therefore, desirable to reduce the number of components necessary to provide reference values in sensing circuitry for integrated circuit memory arrays while maintaining the speed of operation and the accuracy of the reference values produced.

SUMMARY OF THE INVENTION

It is, therefore, an object of the present invention to provide improved sensing circuitry for integrated circuit memory arrays.

It is another object of the present invention to provide circuitry for generating reference values which more accurately represent the desired values than do prior art circuits.

It is yet another object of the present invention to provide an arrangement for providing accurate reference values for the reference circuitry of an integrated circuit memory array while maintaining the speed of operation of the array.

These and other objects of the present invention are realized in a circuit for providing reference voltages to be used by sense amplifiers of the output circuitry of an integrated circuit memory array to allow the sense amplifiers to ascertain the values stored by memory cells of the array comprising a first branch of the circuit; means for providing a first current through the first branch of the circuit; a second branch of the circuit including a first transistor device; means for mirroring the first current through the second branch of the circuit including the first transistor device; a plurality of output branches of the circuit each connected to provide a reference voltage to a sense amplifier, each of the output branches including a second transistor with characteristics essentially identical to the characteristics of the first transistor; and means for mirroring the current through the first transistor through the second transistor, the last mentioned means including means for providing voltages at all terminals of the second transistors equal to the voltages at all terminals of the first transistor.

These and other objects and features of the invention will be better understood by reference to the detailed description which follows taken together with the drawings in which like elements are referred to by like designations throughout the several views.

DETAILED DESCRIPTION OF THE INVENTION

Figure 1:
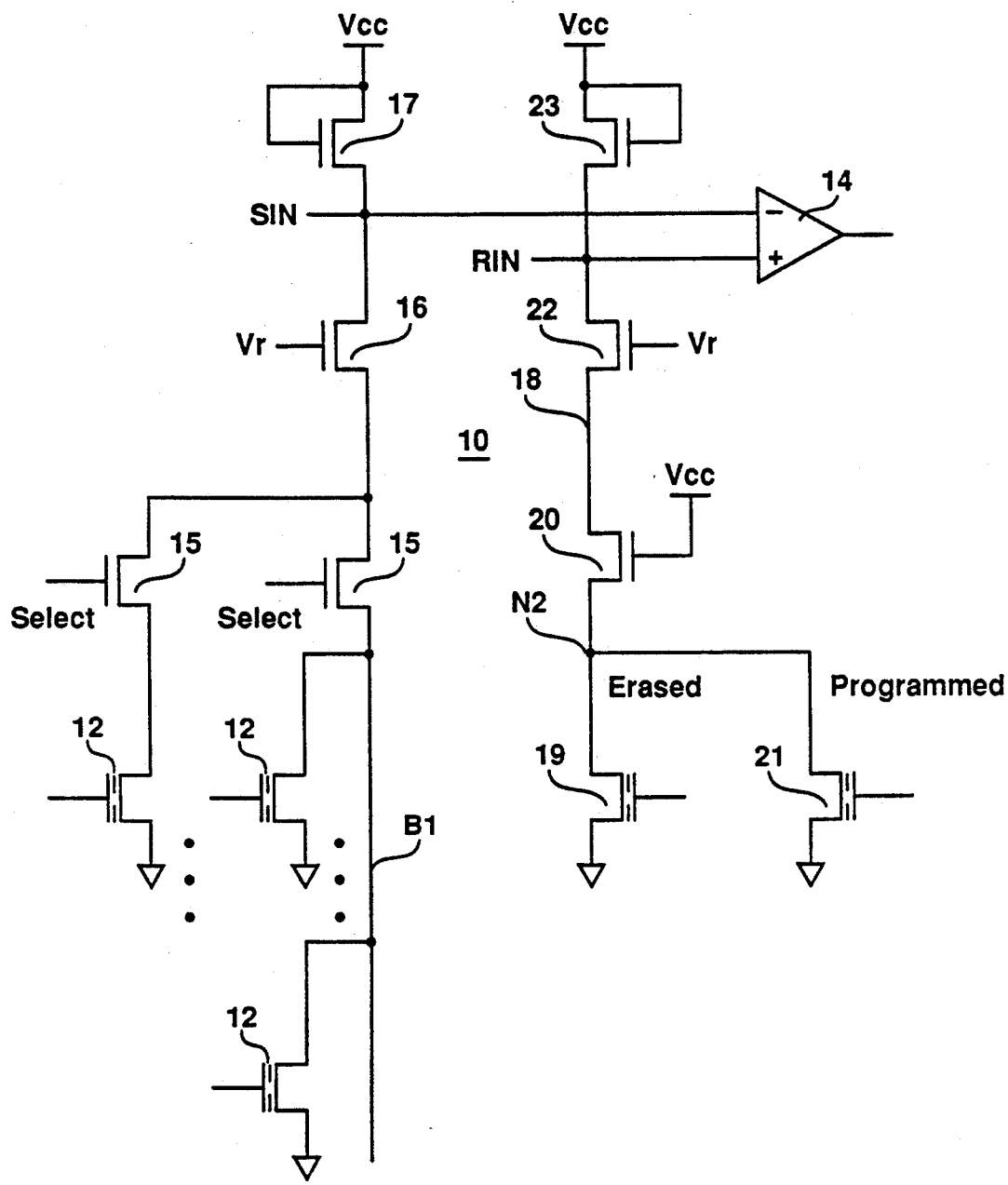
FIG. 1 is a circuit diagram illustrating a circuit designed in accordance with the prior art.

Referring now to FIG. 1, there is illustrated a circuit diagram of an arrangement in accordance with the prior art. The circuit 10 illustrated includes circuitry for sensing the condition of the memory cells connected to a single bitline (column) of an integrated circuit memory array. In a memory array in which sixteen individual bitlines are sensed in parallel to read the values stored in a memory array, the circuitry illustrated is repeated at least sixteen times, once for each bit read from the array.

The circuit 10 illustrated includes a plurality of memory cells 12. These cells are typically metal-oxide-silicon field effect transistors (MOSFETs) connected to store either a zero or a one condition. In the preferred embodiment of the invention, the memory array is constructed of floating gate MOSFETs arranged as flash electrically-erasable programmable read-only memory (flash EEPROM). A flash EEPROM memory array includes a large plurality of floating-gate field effect transistors arranged in typical row and column fashion to function as memory cells with circuitry for accessing the individual cells and placing the memory transistors of those cells in one of two memory conditions. A flash memory cell, like a typical EPROM cell retains information when power is removed.

The individual memory cells may be programmed by placing a charge on the floating gate of the transistors. When programmed, the transistor does not conduct when interrogated by a read signal at its gate terminal; and this programmed condition normally represents a zero value. When the charge on the floating gate has been removed by erasing, the transistor conducts when an appropriate read voltage is placed on its gate terminal; and this erased condition normally represents a one value.

A number of the devices 12 have their drain terminals connected to the same bitline. Typically, a large number of devices 12 might be so connected to the same bitline. Another equal number of devices 12 are similarly connected to each of the other bitlines (only one of which is shown) which may be connected to the same sensing amplifier 14. The source terminals of each of the devices 12 are connected to ground. The drain terminals of all of the devices 12 connected to any single bitline may be connected through the source and drain terminals of an N channel field effect transistor (FET) 15 which acts as a column select transistor. A plurality of such column select transistors 15 connect a number of bitlines to another N channel field effect transistor 17 which is joined to a source voltage Vcc. Each of the devices 17 is biased "on" to provide current to a bitline when the column select device 15 is enabled to complete a path from the source voltage Vcc.

Connected between the column select devices 15 and the device 17 is another N channel FET device 16. The device 16 is provided to control the current through the bitlines so that a voltage may be sensed at an SIN terminal which will represent either a logic one or a zero. For this purpose, the gate of the device 16 is connected to a source of constant reference voltage so that the current through the device 16 remains relatively constant when a memory device 12 is conducting (a data value of one) and restricts but still holds constant the current through the device 16 when a device 12 is not conducting (a data value of zero). Thus, the voltage at the SIN terminal is high indicating a zero when a particular column is selected and a device 12 in that column which stores a zero is read. This high voltage is essentially equal to the source voltage Vcc less the voltage drop Vt across the device 17 since no current is flowing. On the other hand, when the device 12 being read stores a one condition and conducts, the voltage at the SIN terminal is equal to the source voltage Vcc less the voltage drop Vt across the device 17 less the source-to-drain impedance of the device 17 multiplied by the current, a lower level of voltage. The voltage at the SIN terminal is furnished to one input terminal of a differential amplifier 14 which functions as a sense amplifier.

The gate terminals of one of the devices 12 connected to each bitline are connected to a single wordline. By decoding an address to select a particular wordline and a particular bitline, the condition of any individual memory device 12 may be sensed. To accomplish this, the voltage at the SIN terminal is compared to a reference voltage produced at an RIN terminal of a reference bitline 18. The reference bitline 18 is designed only to produce a constant voltage at the RIN terminal against which the SIN voltages may be compared by the sense amplifier 14. To accomplish this, the reference bitline 18 is connected to a plurality of reference memory devices 19 and 21. An N channel FET current control transistor 22 is arranged in the reference bitline to match the characteristics of the device 16, an N channel FET device 20 is arranged in the reference bitline to match the characteristics of the select device 15, and an N channel FET device 23 is connected to the source of voltage Vcc and biased on. The reference devices 19 and 21 are of the same size as the memory devices 12, and the current control device 22 is of the same size as the current control device 16.

The pair of transistors 19 and 21 are connected between ground and a node N2 to represent the memory transistors 12 in the erased and programmed states.

In addition, some number of other transistors may be connected in parallel with the transistors 19 and 20 in each reference circuit where a memory circuit may assume a number of states to assure that the reference circuit produces the correct reference values at the RIN node in each of the states of the memory cells 12. For example, it is a peculiarity of flash EEPROM memory arrays that the memory arrays are read after both erasure and programming to verify that the values stored in the memory cells are those expected to be stored by the particular operation. Since the memory cells have different switching voltages in the erased and programmed conditions, the current through the memory transistors differs in these condition. Thus, when the array has been erased only the transistor 19 is enabled during a read to accomplish the verification process. When the array has just been programmed, only the transistor 21 is enabled during a read to accomplish the verification process. During a standard read operation, both of the transistors 19 and 21 are enabled so that the current through the two devices adds in the reference leg.

During any of these read operations, the appropriate device (or devices) 19 or 21 are selected and current flows through the transistor 23. Consequently, there is a voltage drop due to current through the device 23, and the voltage at the terminal RIN is always less than the voltage level at the SIN terminal which indicates a zero value. Moreover, the transistor 23 is constructed such that the voltage RIN is always greater than the voltage level at the SIN terminal which indicates a one value.

In order to provide for correct operation of the memory cells of the array, it has been necessary in prior art arrangements to include reference circuits such as that illustrated in FIG. 1 for each of the bitlines to be read in parallel through the sensing amplifiers of a memory array. When the readout is arranged to occur on a sixteen bit basis, sixteen such reference circuits are necessary. Often redundant circuitry is provided, and it is typical for eighteen reference circuits to be required for sixteen bit readout values. Each of these reference circuits adds six individual transistor devices to the memory array. Consequently, the reference circuitry requires over one hundred transistor devices to implement. This requires a significant amount of space on the integrated circuit chip of the memory array and increases the cost of the array. Moreover, it is typical that the values of the circuitry of each of the reference circuits are adjusted during testing of the manufactured array. This adjusting or trimming can consume a significant amount of time and further increase the cost of the memory array.

Figure 2:
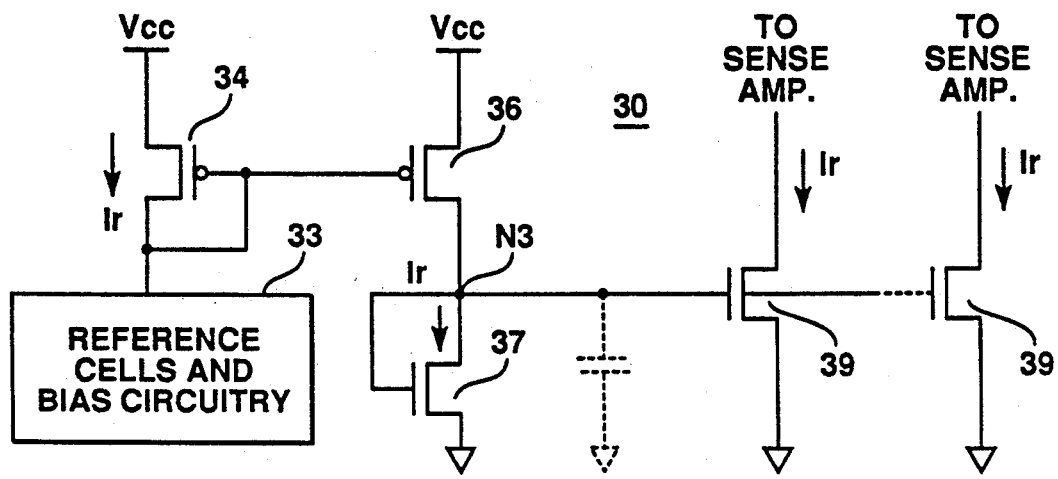
FIG. 2 is a circuit diagram illustrating a second circuit designed in accordance with the prior art.

In order to reduce the cost of memory arrays, current mirroring schemes have been used to reduce the number of reference circuits necessary to a memory array and the cost of trimming those cells after manufacture. FIG. 2 illustrates a prior art arrangement using current mirroring in order to produce this desired result. The circuit 30 illustrated includes a reference circuit 31 in which most of the elements are represented within a box 33. However, the current through the reference circuit (the reference current) is mirrored by connecting the gate of a P type transistor 34 in the reference circuit to the gate of another identical P type transistor device 36. The sources of the transistors 34 and 36 are each connected to Vcc so that the current through the devices should be identical. The current through the device 36 appears at a node N3. The voltage at the node N3 is applied at the gate terminals of each of a plurality of reference transistors 39. Each of the transistors 39 is connected in a similar reference leg between Vcc and ground so that identical currents presumably flow through each of the reference legs. In this manner, reference currents are created for each of the individual sensing circuits using substantially fewer transistor devices than are required in circuits utilizing complete matching reference circuits for each sensing amplifier.

Two problems occur with these current mirroring circuits. First, the number of devices 39 connected to the node N3 and the length of the conductors increases the inherent capacitance at that node substantially. This has the effect of increasing the time constant necessary for charging that capacitance and slows the switching of the transistor devices 39. In addition, each of the devices 36 and 37 has grown smaller as the number of devices in the array has increased. Consequently, the individual devices cannot carry as much current as is optimum; and the charging rate is further slowed. This makes the circuit slower than is generally required for operation in a high speed memory array. This is especially true of the periods during which the circuitry is being powered up and returned to a power down condition; the array simply will not switch fast enough.

Figure 3:
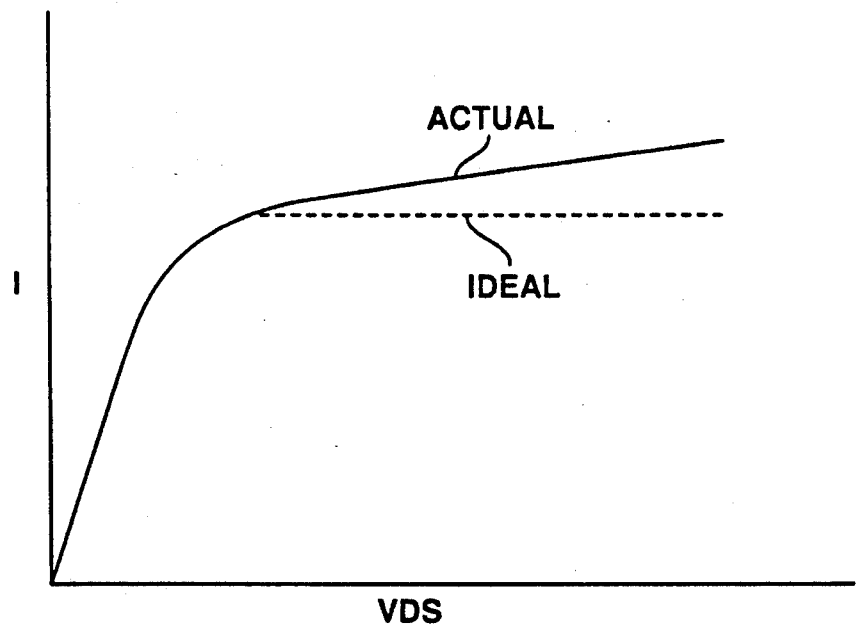
FIG. 3 is a graph illustrating the values of current through versus voltage across current mirroring devices used in prior art circuits.

A second problem with the mirroring arrangement of FIG. 2 is that the currents mirrored are not, in fact, as accurately identical as might be expected. FIG. 3 illustrates a curve of the current I through the mirroring transistors 39 versus the voltage across the drain and source terminals of each of the transistors 39. As may be seen, even though the transistors are operating in the saturated range, the current through the devices, in fact, varies with the voltage between the source and drain terminals. Consequently, the variations of voltage, temperature, and other factors can cause the currents to differ to an extent. This variation in current through the identically-sized transistor devices of the reference legs makes the circuit operate less accurately than is desirable in fast memory arrays.

Figure 4:
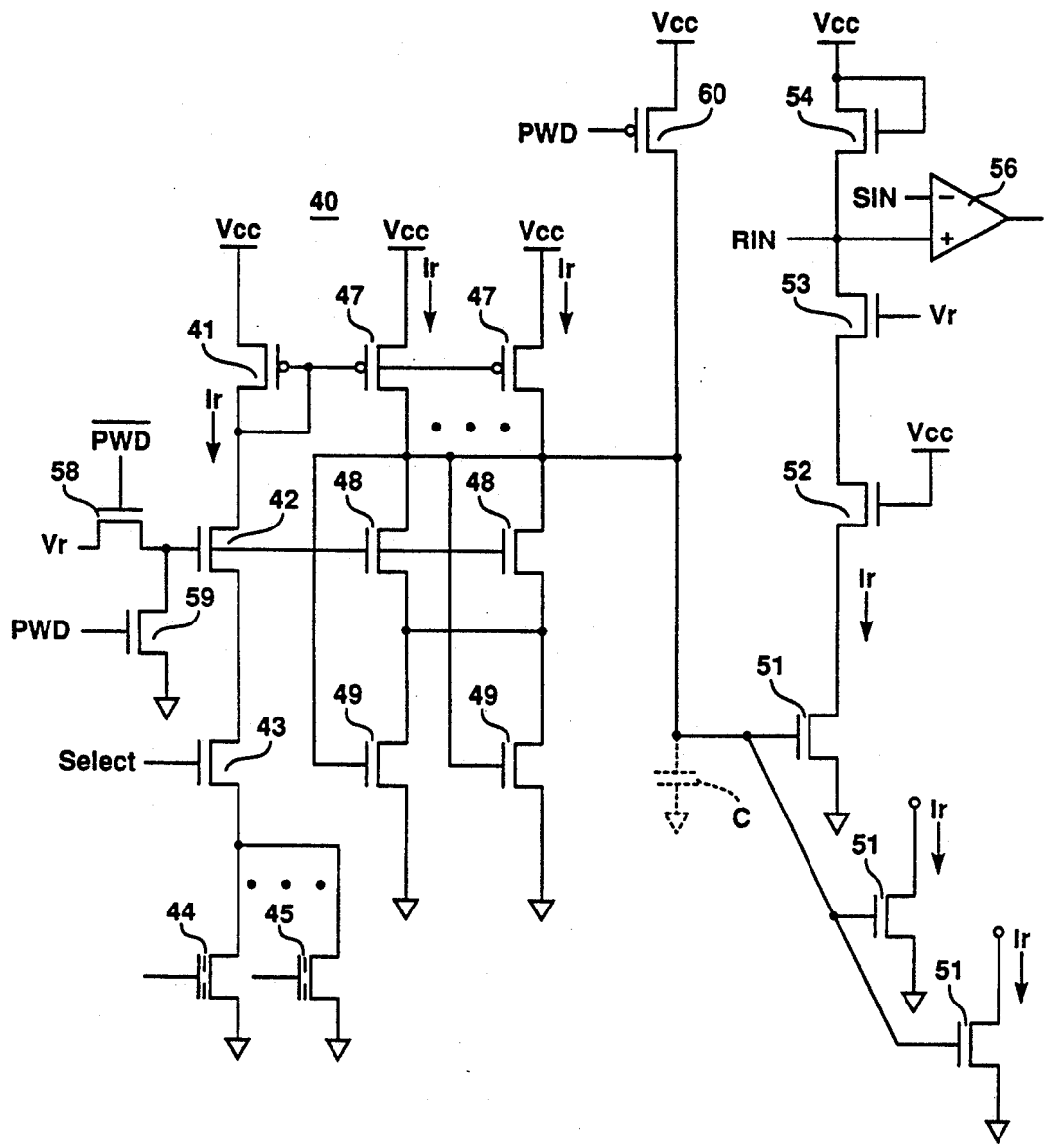
FIG. 4 is a circuit diagram illustrating the details of a circuit constructed in accordance with the present invention.

FIG. 4 illustrates a circuit 40 designed in accordance with the present invention which allows current mirroring to take place to reduce the number of devices used for the reference circuitry and the testing costs attendant thereon while providing more accurate mirroring of currents through the reference legs and an increase in the speed of operation. The circuit 40 includes the circuitry necessary to generate the reference current and to mirror that current throughout the array. The bitlines of the array are identical to those shown above and are not shown.

The primary circuitry for generating the reference current includes a P channel device 41 with its source terminal connected to a source voltage Vcc and its gate terminal connected to its drain terminal. An N channel current-limiting device 42 has its source and drain connected between the device 41 and an N channel selection transistor 43. N channel transistor devices 44 and 45 provide the paths to ground for erase and programmed currents, respectively. The voltage Vr is provided to the transistor 42 using an N channel switching device 58 during the normal operating condition of the array by the signal PWD# (not power down) applied at its gate terminal. Ground is applied to the gate of the transistor 42 when the power level is reduced to a power down condition using an N channel device 59 and the signal PWD (power down).

The current Ir in the reference current generating leg just described is mirrored to the remainder of the circuit through three transistor devices 47, 48, and 49 connected between the voltage Vcc and ground. The P channel transistor 47 is identical to the transistor 41 and has its gate connected to the same voltage as the gate of the transistor 41. The transistor 48 is identical to the current-limiting transistor 42 and has its gate connected to the same voltage Vr (during operation) as the gate of the transistor 42.

Since the P channel transistor 47 is identical to the P channel transistor 41 and has its gate and source terminals connected to identical voltages, the current through the two transistor devices will be equal, the reference current Ir. Thus the current Ir is mirrored through the P device 47. Moreover, since the current through the device 47 is Ir, the voltage at the drain of the device 48 is equal to the voltage at the drain of the transistor 42. With the voltages at the drain and gate terminals controlled to be equal, the current through the transistors 42 and 48 is constrained to be identical and equal to Ir. The current Ir through the device 47 is transferred through the N channel device 49.

In order to provide the same reference current Ir through the reference branch which is connected to a sensing amplifier 56, the gate of an N channel transistor device 51 is connected to the gate of the N channel device 49. The transistor devices 49 and 51 are identical, and both have their source terminals connected to ground; consequently, the current through the two devices in saturation should be the same reference current Ir.

However, the voltages from source to drain across the devices 49 and 51 are also constrained to be the same by the circuitry of the present invention. This is accomplished by placing in the reference branch connected to the sensing amplifier 56 a transistor 53 which matches the characteristics of the device 42 (and 48). The drain of the transistor 53 is connected to Vcc through an N channel device which is biased to conduct. A device 52 which matches the characteristics of the select device 43 of the current generating branch is also placed in the path.

The voltage Vr is applied to the gate of the device 53. Thus, with the current through the device 53 controlled to be approximately Ir by the device 51, the voltage drop between the gate and source terminals of the device 53 is identical to that across the gate to source terminals of the devices 42 (and 48). Since the devices 52 and 43 are essentially switches and have very little drop (and are identical in any case), the voltages at all of the terminals of the transistors 49 and 51 are identical. More particularly, with the voltage Vr at the gate terminal of the device 53 and the current Ir therethrough, the voltage at the drain of the device 51 is constrained to be equal to the voltage at the drain of the transistor 49. Thus, the voltage at the source, drain, and gate terminals of the transistors 51 and 49 are identical. This constrains the value of the current Ir through each of the devices to be identical even though the voltage from source to drain of a saturated transistor may vary as illustrated in the curve of FIG. 3. The currents through the devices 51 and 49 are identical in the present circuit even though the devices are operating outside the saturation range since the voltages at all of the terminals are equal. Consequently, the current accuracy desired has been attained by the present invention.

In order to provide the increased speed desired to operate within the constraints of the high speed memory array, a number of improvements are made to the circuit of this invention over prior art circuits. The first of these improvements provides the switching signals PWD and PWD# which control the voltage at the gates of the transistors 42 and 48 to transfer rapidly between the values Vr and ground when power down and power up signals are given. This quickly disables the transistors 48 on power down and quickly switches them back on at power up. Next the reference circuit branches including the transistors 47, 48, and 49 are duplicated a sufficient number of times to provide enough current to charge the inherent capacitance of the multiple devices 51 and the interconnect lines illustrated as C in FIG. 4 and rapidly enable the transistors 51. The number of current carrying branches used are selected to provide the maximum current possible without providing too much capacitive loading to the gate terminals of the transistors 47. In the preferred embodiment of the invention, five such legs are included in a sixteen bit output arrangement having two additional redundant bit lines.

In addition, a P channel transistor device 60 has been added to connect the gates of the transistors 51 to Vcc upon receipt of the power down signal PWD. This device 60 switches on in the power down state and holds the gate of the transistor 51 at Vcc. When the array is powered up again, it is a faster transition from Vcc to the desired gate voltage of the transistors 51 than were the transition to be from ground. This is true because the larger N channel devices 49 are capable of furnishing more current than are the weaker P channel devices 47. The availability of additional current helps to charge the inherent capacitance of the circuitry connected to the gate of the transistors 51 of the sixteen reference branches connected to the sensing amplifiers 56 and speeds the switching of the array on power up of the circuitry.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for providing reference voltages to be used by sense amplifiers of output circuitry of an integrated circuit memory array to allow the sense amplifiers to ascertain the values stored by memory cells of the array comprising:
   a first branch of the circuit;
   means for providing a first current through the first branch of the circuit;
   a second branch of the circuit including a first transistor device;
   means for mirroring the first current through the second branch of the circuit including the first transistor device;
   a plurality of output branches of the circuit each connected to provide a reference voltage to a sense amplifier,
      each of the output branches including a second transistor with characteristics essentially identical to the characteristics of the first transistor; and
   means for mirroring the current through the first transistor through the second transistor, the last mentioned means including means for providing voltages at all terminals of the second transistors equal to the voltages at all terminals of the first transistor.

2. A circuit for providing reference voltages to be used by sense amplifiers of output circuitry of an integrated circuit memory array to allow the sense amplifiers to ascertain the values stored by memory cells of the array comprising:
   a first branch of the circuit;
   means for providing a first current through the first branch of the circuit;
   a second branch of the circuit including a first transistor device,
      the second branch of the circuit being duplicated a plurality of times to optimize the switching speed of the circuit on power down and power up;
   means for mirroring the first current through the second branch of the circuit including the first transistor device;
   a plurality of output branches of the circuit each connected to provide a reference voltage to a sense amplifier,
      each of the output branches including a second transistor with characteristics essentially identical to the characteristics of the first transistor; and
   means for mirroring the current through the first transistor through the second transistor,
      the last mentioned means including means for providing voltages at all terminals of the second transistors equal to the voltages at all terminals of the first transistor.

3. A circuit for providing reference voltages to be used by sense amplifiers of output circuitry of an integrated circuit memory array to allow the sense amplifiers to ascertain the values stored by memory cells of the array comprising:
   a first branch of the circuit;
   means for providing a first current through the first branch of the circuit;
   a second branch of the circuit including a first transistor device;
   means for mirroring the first current through the second branch of the circuit including the first transistor device;
   a plurality of output branches of the circuit each connected to provide a reference voltage to a sense amplifier,
      each of the output branches including a second transistor with characteristics essentially identical to the characteristics of the first transistor;
   means for mirroring the current through the first transistor through the second transistor,
      the last mentioned means including means for providing voltages at all terminals of the second transistors equal to the voltages at all terminals of the first transistor; and means for providing a voltage at the gates of the second transistors when power to the circuit is reduced to enable the quick turn on of the second transistors when power to the circuit is increased.

4. A circuit for providing reference voltages to be used by sense amplifiers of output circuitry of an integrated circuit memory array to allow the sense amplifiers to ascertain the values stored by memory cells of the array comprising:
a first branch of the circuit;
means for providing a first current through the first branch of the circuit;
a second branch of the circuit including a first transistor device,
means for mirroring the first current through the second branch of the circuit including the first transistor device;
a plurality of output branches of the circuit each connected to provide a reference voltage to a sense amplifier,
each of the output branches including a second transistor with characteristics essentially identical to the characteristics of the first transistor; and
means for mirroring the current through the first transistor through the second transistor, the last mentioned means including means for providing voltages at all terminals of the second transistors equal to the voltages at all terminals of the first transistor;
means for rapidly disabling the means for providing a first current through the first branch of the circuit when power to the circuit is reduced; and
means rapidly enabling the means for providing a first current through the first branch of the circuit when power to the circuit is increased.

5. A circuit for providing reference voltages to be used by sense amplifiers of output circuitry of an integrated circuit memory array to allow the sense amplifiers to ascertain the values stored by memory cells of the array as claimed in claim 4 in which the means for rapidly disabling the means for providing a first current through the first branch of the circuit when power to the circuit is reduced comprises a current limiting device connected in the first branch, and means for switching the current limiting device to a non-conducting state when power is reduced; and the means for rapidly enabling the means for providing a first current through the first branch of the circuit when power to the circuit is increased comprises means for switching the current limiting device to a conducting state when power is increased.

* * * * *